(12) United States Patent
Francis et al.

(10) Patent No.: US 6,482,681 B1
(45) Date of Patent: Nov. 19, 2002

(54) HYDROGEN IMPLANT FOR BUFFER ZONE OF PUNCH-THROUGH NON EPI IGBT

(75) Inventors: Richard Francis, Manhattan Beach; Chiu Ng, El Segundo, both of CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/565,922

(22) Filed: May 5, 2000

(51) Int. Cl.[7] ............... H01L 21/332; H01L 21/265; H01L 21/425
(52) U.S. Cl. ............... 438/138; 438/137; 438/520; 438/528
(58) Field of Search ............... 438/268, 269, 438/270, 271, 272, 273, 274, 520, 528, 206, 212, 138

(56) References Cited

U.S. PATENT DOCUMENTS

| | | | |
|---|---|---|---|
| 5,136,349 A | | 8/1992 | Yilmaz et al. |
| 5,234,851 A | | 8/1993 | Korman et al. |
| 5,528,058 A | | 6/1996 | Pike, Jr. et al. |
| 5,631,484 A | | 5/1997 | Tsoi et al. |
| 5,751,023 A | * | 5/1998 | Aono ............ 257/138 |
| 5,808,345 A | | 9/1998 | Kinzer |
| 5,914,503 A | * | 6/1999 | Iwamuro et al. ........... 257/133 |
| 5,985,708 A | | 11/1999 | Nakagawa et al. |
| 6,043,126 A | | 3/2000 | Kinzer |
| 6,054,748 A | * | 4/2000 | Tsukuda et al. ........... 257/496 |
| 6,072,199 A | * | 6/2000 | Iwamuro ............ 257/139 |
| 6,100,575 A | * | 8/2000 | Minato ............ 257/617 |
| 6,162,665 A | * | 12/2000 | Zommer ............ 438/133 |
| 6,274,892 B1 | * | 8/2001 | Kub et al. ............ 257/131 |

FOREIGN PATENT DOCUMENTS

| | | |
|---|---|---|
| JP | 6318706 | 11/1994 |
| JP | 9121052 | 5/1997 |
| JP | 02001160559 A * | 6/2001 |

OTHER PUBLICATIONS

International Search Report dated Jun. 20, 2001 from the International Searching Authority for corresponding PCT Appln. No. PCT/US01/13322.

* cited by examiner

Primary Examiner—John F. Niebling
Assistant Examiner—Viktor Simkovic
(74) Attorney, Agent, or Firm—Ostrolenk, Faber, Gerb & Soffen, LLP

(57) ABSTRACT

An IGBT is formed in a thin (less than 250 microns thick) float zone silicon wafer using a hydrogen implant to form an $N^+$ buffer layer at the bottom of the wafer. A weak anode is formed on the bottom of the wafer. A single hydrogen implant, or a plurality of hydrogen implants of progressively shallower depth and increasing dose can be used to form the implant in a diffused float zone wafer. The process may also be used to form an $N^+$ contact region in silicon to permit a good ohmic contact to the silicon for any type device.

25 Claims, 3 Drawing Sheets

HYDROGEN IMPLANT FOR BUFFER ZONE OF PUNCH-THROUGH NON EPI IGBT

RELATED APPLICATIONS

This application relates to U.S. Ser. No. 09/566,219, filed May 5, 2000; U.S. Ser. No. 09/565,148, filed May 5, 2000; U.S. Pat. No. 6,242,288, issued Jun. 5, 2001 filed; and U.S. Ser. No. 09/565,973, filed May 5, 2000.

FIELD OF THE INVENTION

The present invention relates to insulated gate bipolar transistors (IGBTs) and more specifically relates to a novel structure and process for making a punch-through type IGBT in float zone (non-epitaxial) silicon.

BACKGROUND OF THE INVENTION

Present day IGBTs are commonly made as "punch-through" devices in which a D-MOS type structure is formed in the top of an epitaxially deposited silicon wafer. The epitaxially deposited layer is formed atop a higher concentration buffer layer of the same concentration type which is, in turn formed on a substrate of opposite concentration type and which acts as a minority carrier injection source. In such "punch-through" devices, the electric field across the silicon under reverse bias reaches from the top surface of the silicon to the buffer layer which acts as a depletion layer "stop".

The $N^+$ buffer layer in the punch-through type IGBT plays a key role in the operation of the device. Thus, the thickness and concentration of the $N^+$ layer will greatly affect the switching and breakdown voltage characteristics of the device. As stated above, the buffer layer acts as a depletion layer stop when the device is under reverse bias, and the $N^+$ buffer layer also has a low lifetime and controls the injection efficiency of one of the equivalent bipolar transistors forming the IGBT. When using the $N^+$ buffer, a thinner $N^-$ epitaxial layer can be used, with a higher resistivity to achieve a particular breakdown requirement. As a general rule, and with a given technology, a punch-through type IGBT will have a lower forward voltage drop $V_{ceon}$ and a better switching trade off than a "non-punch-through" IGBT device.

The wafer used for a punch-through device is relatively thick, and can be easily processed by existing wafer implanters and other wafer fabrication equipment for high volume production without excessive breakage. However, wafers with epitaxially formed layers ("epi wafers") are expensive. Thus, the conventional method of making a punch-through IGBT uses an epi wafer which is normally made by first growing an $N^+$ layer on a boron doped substrate; followed by the epitaxial deposition of $N^-$ silicon on top of the $N^+$ layer. The thickness and resistivity of the $N^-$ and $N^+$ layers are easily adjustable to optimize the IGBT performance for low voltage but it is much harder to adjust or control the process for thicker and higher resistivity $N^-$ epitaxial silicon needed for higher voltage (in excess for example of about 600 volts) devices.

It is possible to form "non-punch-through" IGBT devices directly in a float zone (non-epi) material to reduce cost. Such devices, are described in an IEEE publication 0-7803-3106-0/96 entitled "NPT-IGBT-Optimizing for Manufacturability" by Darryl Burns et al. These devices employ a D-MOS junction pattern in the top of a float zone wafer which is thinned to a value dependant on a desired breakdown voltage and speed for the ultimate device and are then provided with a collector which is a relatively lightly doped shallow junction which is a relatively inefficient injector known as a "weak" or "transparent" collector. (The terms collector and anode are frequently interchanged.) This technique produces a high speed device without the need for heavy metal or E beam lifetime killing.

The non-punch through device has no buffer layer and the electric field across the silicon does not reach the weak collector. Thus, these devices use less expensive float zone material, but do not work in the punch through mode.

The thickness of the non-punch-through IGBT wafer is determined by the device blocking voltage, which can range from about 80 microns for a 600 volt device to about 250 microns for a device which breaks down at 1700 volts. In general, the lower the breakdown voltage, the thinner the wafer must be. These ultra thin wafers experience excessive breakage during handling in the manufacturing process so that handling of the wafer must be kept to a minimum. Most production equipment used today for high volume production cannot handle these wafers without costly modification.

It is also known that a punch-through IGBT can be made in the less expensive float zone material. Thus, an $N^+$ buffer layer can be added to the float zone device, as by implanting a high concentration buffer zone of well controlled gradient into the bottom surface of the wafer, in front of the weak anode. By creating a punch-through IGBT in a float zone wafer, one can reap the benefits of the lower wafer costs of the non-punch-through IGBT and the better $V_{ceon}$ and switching trade off of the punch through IGBT. The conventional way of creating the $N^+$ buffer layer in the float zone material is by thinning the wafer to a precise thickness; implanting an N type dopant such as phosphorus or arsenic into the bottom surface of the silicon (after thinning); followed by a high temperature anneal (greater than about 600° C.) to activate the dopant. A shallow P region is then formed on the bottom surface. However, there are several problems with this approach.

1. The float zone wafers are very thin (60 to 150 microns thick) and are subject to breakage during the implant and anneal steps.

2. When either phosphorus or antimony is used for the buffer layer $N^+$ dopant, an implant energy of 600 KeV to 2 MeV is required to achieve the desired implant depth. Such high energy implanters are very expensive and take up a large space in wafer Fab facility.

3. To reduce wafer breakage, the $N^+$ buffer layer can be formed prior to the backside metal deposition after the front side metallizing and patterning are done. However, with the front side metal already in place, the anneal of the $N^+$ implant will be restricted to a temperature which is below the deposition temperature of the top side passivation layer which is 350° C. to 425° C. Therefore, only a very small portion of the implant dopant will be annealed, and the degree of annealing varies greatly over a very small temperature range.

BRIEF DESCRIPTION OF THE INVENTION

In accordance with the invention a punch-through IGBT is formed in float zone, non-epi material by a novel process in which both a buffer layer and the collector are referred to the back surface of the wafer. After wafer thinning the $N^+$ buffer layer is formed by an implant with hydrogen atoms in an energy range of 100 KeV to 500 KeV at a dose of 1E12 to 1E16 per $cm^2$. This is followed by the formation of a weak anode, as by the implant of a shallow (about 0.1 micron to 0.5 micron) P type region, using, for example, boron atoms.

The wafers are then annealed for 30 to 60 minutes at 300 to 400° C. to activate the hydrogen implant, without damage to the structure (metals and passivation) on the top surface of the device. This is then followed by the deposition of a back contact, for example, Al/Ti/NiV/Ag on the backside.

Note that the anneal process can be integrated into the backside metal deposition process by heating the wafer in the sputtering tool under vacuum prior to the backside metal deposition.

Implanted hydrogen is known to behave as an $N^+$ dopant after implant damage is annealed out. The typical annealing temperature is in the range of 250° C. to 400° C. and preferably between 350° C. and 400° C. It has been found that the activation of the implanted hydrogen is fairly stable and insensitive to temperature variation.

In accordance with a further feature of the present invention, the concentration gradient of the $N^+$ buffer layer in a float zone IGBT with a weak anode is very accurately controlled by forming it with at least one hydrogen implant to a well controlled dose adjacent a weak collector. This implant can be a hydrogen implant at a dose of 1E12 to 1E16 atoms/cm$^2$ and at an energy of 100 KeV to 500 KeV.

Multiple hydrogen implants of progressively shallower and progressively higher total dose can also be used to form a very well controlled maximum dose adjacent the weak collector. This will then even more accurately define the breakdown voltage, speed and $V_{ce}$ characteristics of the punch through non-epi wafer device.

In carrying out the above multiple implant feature of the invention any desired number of sequential implants can be used. Typically, three sequential implants can be made into the bottom of a thinned wafer of hydrogen at 1E13/cm$^2$; 1E14/cm$^2$ and 1E15/cm$^2$ respectively, at energies of 200 KeV, 150 KeV and 100 KeV respectively. Other N type dopants can also be used. For example, sequential phosphorus implants can be made at 1E14/cm$^2$ at 600 KeV and again at 450 KeV, respectively, although they display a greater sensitivity to the annealing condition.

After completing the novel hydrogen implant, the implant is annealed and a P collector implant is performed prior to deposition of the collector contact. The collector contact consists of sequential layers of aluminum, titanium, nickel vanadium and silver.

While the process of the invention is described for an IGBT, the invention can also be used in the manufacture of other devices, for example, power MOSFETs. Thus, the invention can be used to provide an improved ohmic contact on the backside of a wafer by implanting hydrogen, in the range of 5 to 100 KeV and dose of 1E15 atoms/cm$^2$ to 1E16 atoms/cm$^2$ into the backside of the $N^-$ wafer. The wafer is then annealed for 30 to 60 minutes at 300 to 400° C., followed by the sputtering of a contact of layers of Ti/NiV/Ag on the $N^+$ implanted backside of the wafer.

BRIEF DESCRIPTION OF THE DRAWING(S)

DETAILED DESCRIPTION OF THE DRAWINGS

Figure 1:
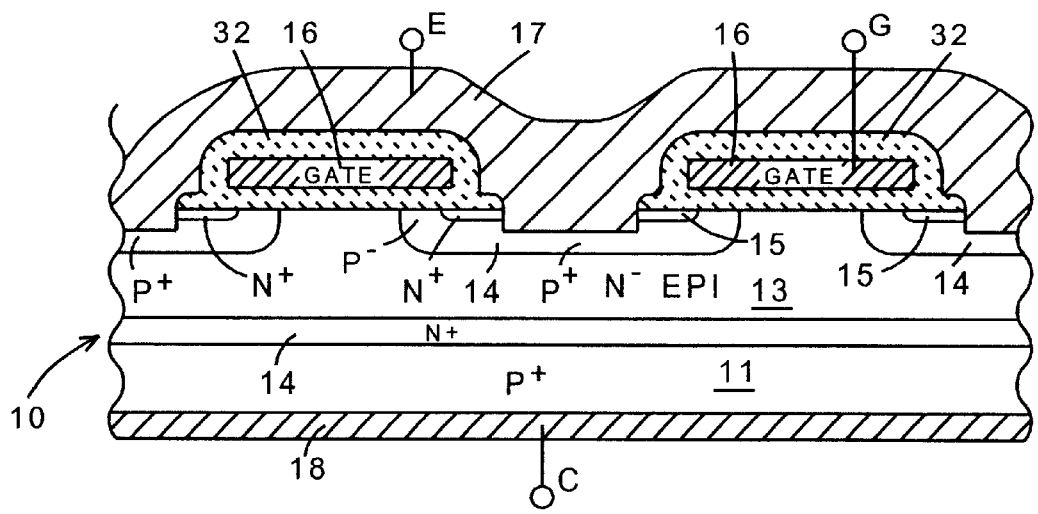
FIG. 1 is a cross-sectional view of a few cells in a typical prior art punch through IGBT.

Referring first to FIG. 1, there is shown a small portion of an IGBT die which is formed in a wafer containing a plurality of simultaneously formed identical die. The terms die and wafer are often used interchangeably herein. The device and process for its manufacture are well known, and U.S. Pat. Nos. 5,661,314 and 5,795,793 describe typical devices and manufacturing processes. In general, the device is formed in a monocrystalline silicon wafer 10 which has a conventional float zone material $P^+$ body 11 which has an $N^+$ epitaxially deposited layer 12 thereon and a further $N^-$ epitaxially deposited layer 13 in which junctions are formed. A conventional D-MOS junction pattern is formed in the top surface of epitaxial layer 13 and consists of a plurality of spaced P type bases or channel regions 14 each containing an annular source 15. Note that any topology can be used for the bases 15, including stripes, trenches and the like.

A conductive polysilicon gate lattice 16 then overlies a conventional gate oxide and the invertible channel region between the exterior of source regions 14. An emitter electrode 17 is then formed over the top surface of wafer 10 and is insulated from gate lattice 16 but contacts the base and source regions 14 and 15. A collector electrode 18 contacts the bottom of region 11.

As previously stated, the $N^+$ buffer layer 12 has a thickness and concentration to obtain the desired switching and breakdown characteristics of the device. The $N^+$ buffer 12 controls the injection efficiency of the bipolar transistor 11/12/13. The thickness of the wafer, with $P^+$ substrate 11 permits manufacture without danger of wafer breakage. However, the epi wafer 10 is expensive.

Figure 2:
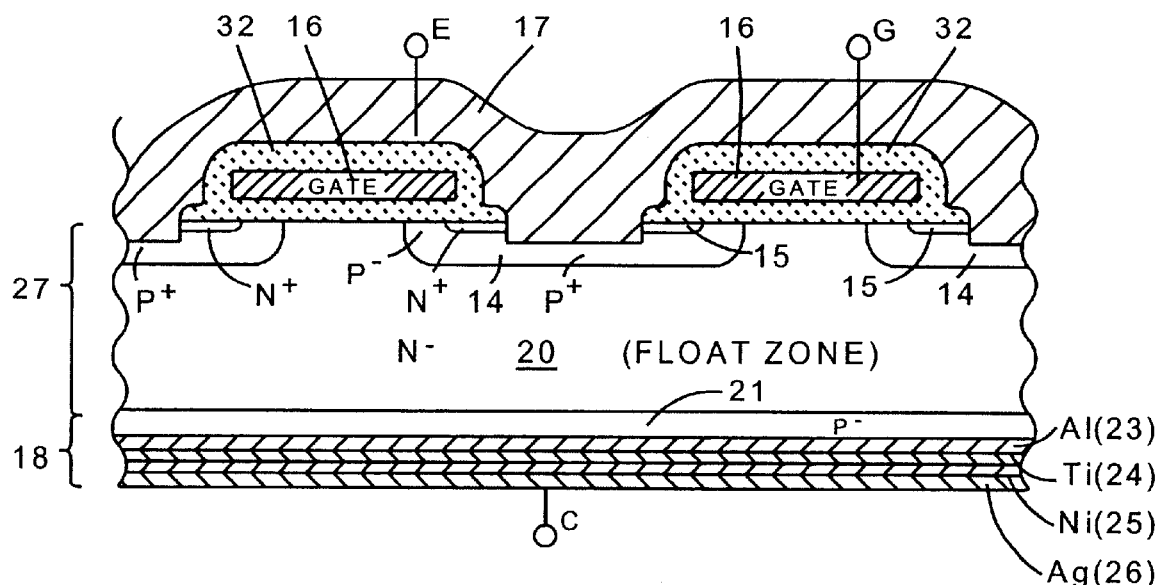
FIG. 2 is a cross-sectional view of a few cells of a typical prior art non-punch through IGBT with an ultra-thin wafer.

In order to avoid the higher cost of wafers with epitaxially deposited layers, it is known that the DMOS pattern of FIG. 1 can be formed in the surface of less expensive float zone material, as shown in FIG. 2. In the device of FIG. 2, the DMOS top pattern, and the top metal and passivation is formed in a relatively thick $N^-$ float zone (FZ) wafer 20 which can be processed without breakage. The bottom surface is then ground and etched to reduce the body thickness 27 to a value dependant on the desired breakdown voltage. A weak $P^-$ collector region 21 is then formed and is covered by a collector electrode 18 consisting of an aluminum layer 23, covered in turn by titanium layer 24, nickel-vanadium layer 25 and silver layer 26. Other metals can be used. The body 27 of the wafer 20 is $N^-$ float zone silicon and it receives the D-MOS junction pattern of FIG. 1 in its top surface.

The $P^-$ weak anode 21 may be implanted or may be an amorphous silicon layer. Such devices are described in copending application U.S. Ser. No. 09/566,219, filed May 5, 2000; U.S. Ser. No. 09/565,148, filed May 5, 2000; U.S. Pat. No. 6,242,288 issued Jun. 5, 2001; and U.S. Ser. No. 09/565,973, filed May 5, 2000.

Figure 3:
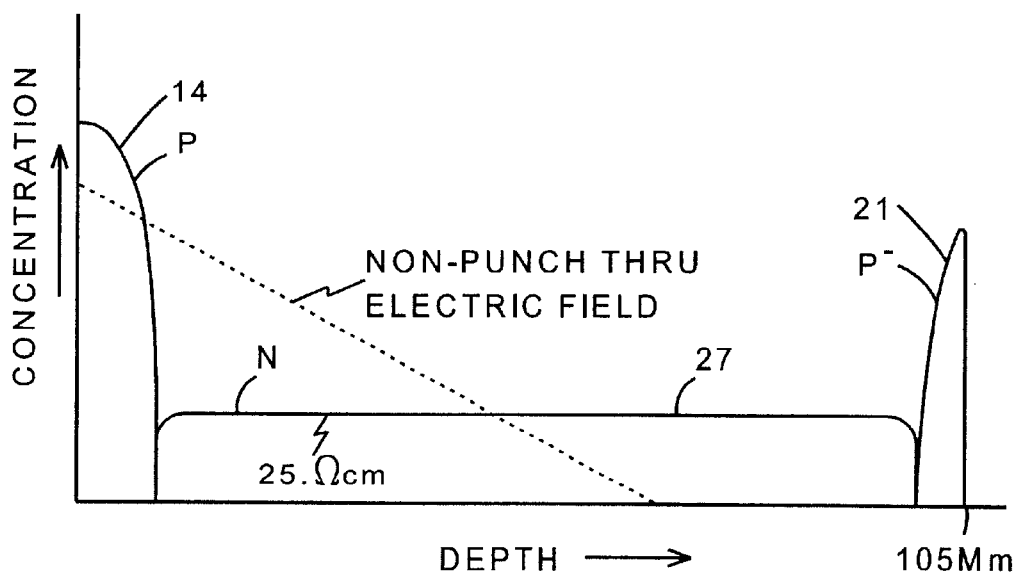
FIG. 3 shows the doping profile for the device of FIG. 2.

The device of FIG. 2 operates in a non-punch through mode of operation. That is, the electric field across the silicon reaches zero before it reaches the bottom of the wafer or die. FIG. 3 shows the concentration profile for the device of FIG. 2. The electric field across the wafer under forward bias is superimposed on this pattern. The P type concentration of base diffusion 14 reduces at its junction with $N^-$ body 27 (typically 25 ohm cm for a 600 volt device) and the $P^-$ weak anode is very shallow, for example 0.1 to 0.5 microns. The thickness of body 27 is highly dependent on breakdown voltage. Thus, body 27 is about 80 microns for a 600 volt device and would be about 250 microns for a 1700 volt breakdown. The electric field across the device is shown in dotted lines, and reduces to zero before reaching collector 22. Thus, the field does not punch through.

Figure 4:
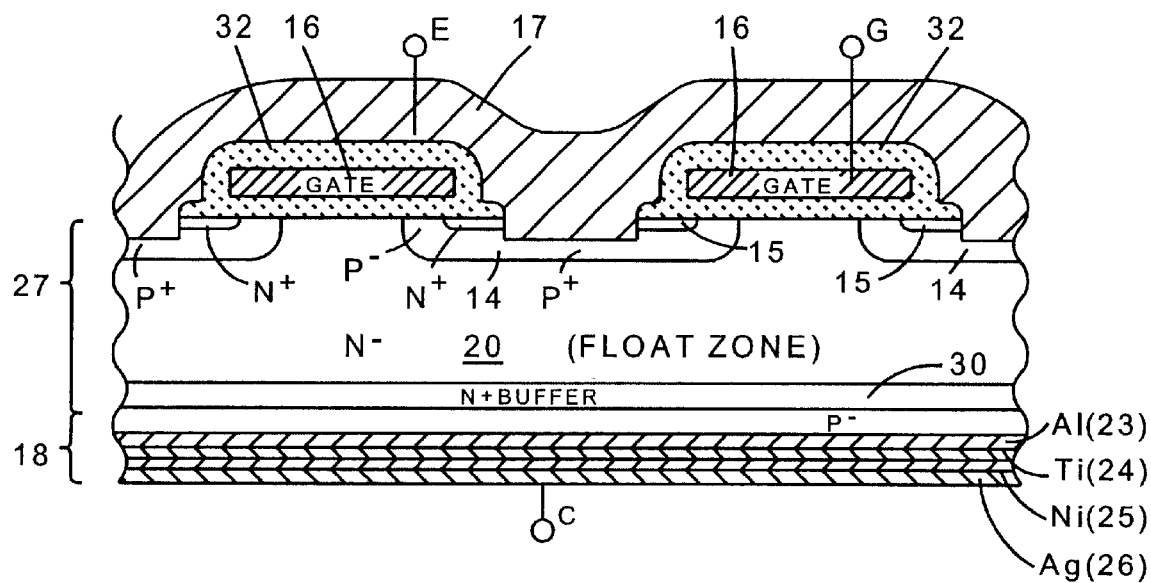
FIG. 4 is a cross-sectional view of a few cells of an IGBT formed in an ultra-thin wafer, and having a buffer layer to define a punch through type device.
Figure 5:
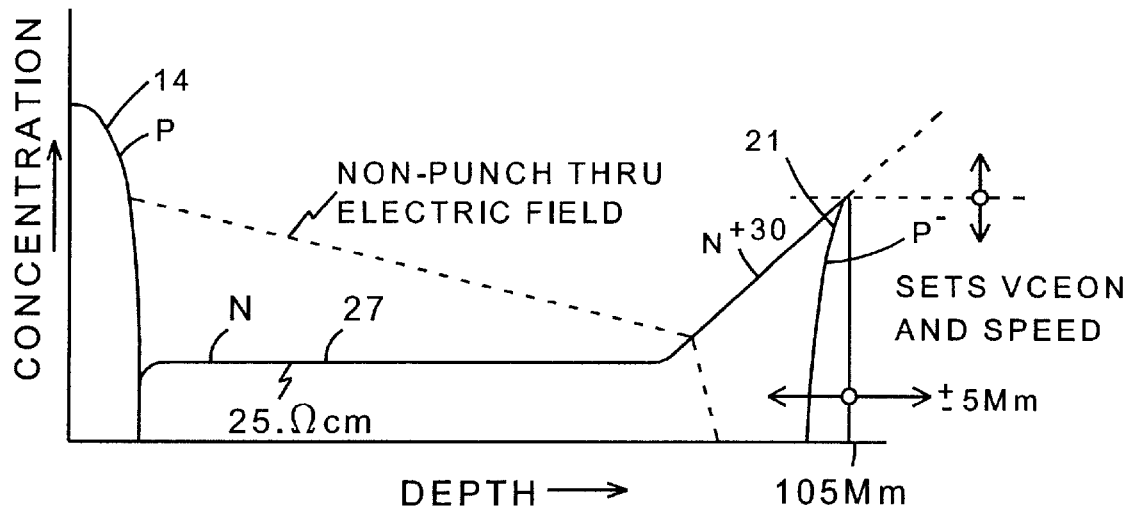
FIG. 5 shows the doping profile for the device of FIG. 4.

The device of FIGS. 2 and 3 can be made to function as a punch through device (like that of FIG. 1) by adding a buffer zone $N^+$ implant 30 as shown in FIG. 4. Components in FIG. 4 which are similar to those of FIG. 3 have the same identifying numerals. The concentration profile for the device of FIG. 4 is shown in FIG. 5. The electric field across body 27 reaches the highly conductive buffer 30 and therefore punches through across the wafer in reverse bias.

The conventional way of forming $N^+$ buffer 30 is by the implant of phosphorus or arsenic atoms into the back of the wafer after the thinning operation, followed by an activation anneal to activate the dopant. These implants require an implant energy of 600 KeV to 2 MeV to reach the desired $N^+$ region depth. This requires an expensive high energy implanter, and added handling of the fragile wafer. Further, the anneal temperature must be kept below the deposition temperature of the top surface passivation layers (350° C. to 425° C.). However, the preferred anneal temperature of phosphorus or arsenic is above about 700° C. Since a lower temperature must be used, only a small portion of the $N^+$ implant dopant 30 will be annealed and the amount of the anneal varies greatly with small temperature change.

In accordance with one feature of the present invention, the $N^+$ region 30 of FIG. 4 is formed by a hydrogen implant which can be carried out with a lower implant energy and with a reduced activation temperature which is well below the temperature which will damage the passivation on the top side of the device.

Thus, hydrogen ions can be implanted with an energy in the range of 100 to 500 KeV at doses in the range of $1E12/cm^2$ to $1E16/cm^2$. Good results have been obtained using an energy of 170 KeV at specific doses of $5E13/cm^2$ to $5E14/cm^2$ of hydrogen ions.

The wafer is then annealed in a forming gas for 30 to 60 minutes at 300° C. to 400° C., followed by a $P^-$ ion implant, or by a P doped amorphous silicon layer deposited by PECVD or by sputtering. A contact is next formed by sputtering of the following metals, in sequence: pure aluminum (1000 Å); titanium (1000 Å); nickel-vanadium (7%V) (4000 Å); silver (6000 Å). An in-situ annealing process prior to aluminum deposition drives off any residual moisture from the wafer surface and ensures good contact between the aluminum and the silicon.

A punch-through IGBT can also created using a diffused wafer. That is, the $N^+$ buffer 30 of FIG. 5 may be diffused prior to the complete thinning of the wafer since the completely thinned wafer cannot be handled without breakage during the diffusion process. After the diffusion, the backside of the wafer is grown down (and then etched for stress relief)from about 400 to 500 microns to less than about 150 microns (for the 1700 volt device) and less for the lower voltage devices (60 microns for a 600 volt devices). A shallow P region is then formed on the bottom surface followed by backside metallization. The thickness and concentration gradient of the $N^+$ buffer strongly determines the forward voltage drop $V_{ce}$ and device speed. In addition, the P region must intersect the $N^+$ gradient curve at an exact concentration level, which sets the $V_{ce}$ and speed of the device. With present day equipment, this intersection will vary by +−5 microns of the targeted thickness. This variation is too high to precisely control the $V_{ce}$ and speed of the device. It is however, difficult if not impossible to control the wafer thickness to greater accuracy with present day equipment. Therefore, the Vce and speed of devices made using the above described process for FIGS. 4 and 5 is very variable and uncontrolled.

The previously described novel process using a hydrogen implant into the bottom of the thinned wafer gives good control of the concentration of the $N^+$ buffer 30 at the bottom surface of the wafer.

Figure 6:
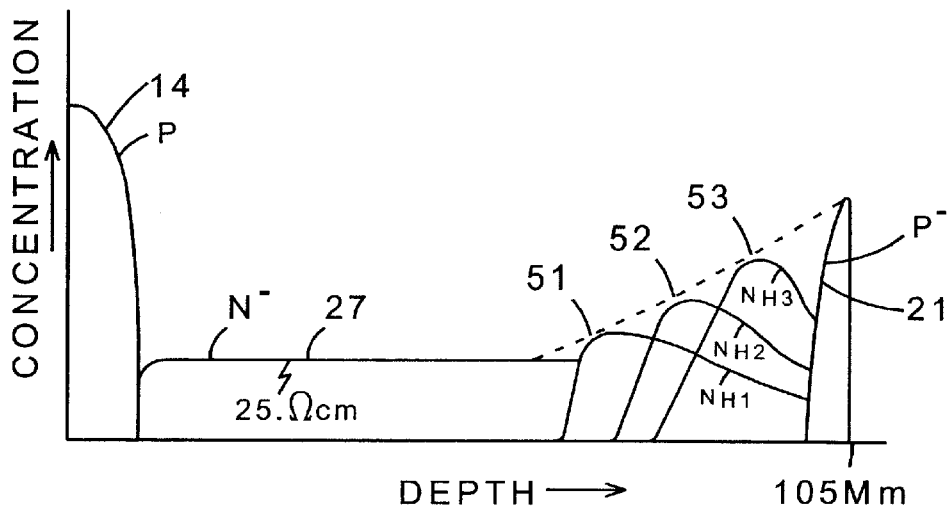
FIG. 6 shows the doping profile of the buffer layer of FIGS. 4 and 5 in accordance with a preferred embodiment of the invention.

FIG. 6 shows a the dopant concentrations obtained from a second embodiment of this invention which produces a device in which the gradient of an $N^+$ buffer layer in FIG. 4 can be controlled with greater accuracy so that the buffer layer concentration at its intersection with the $P^-$ layer 21 and the bottom of the wafer can be very accurately controlled. Thus, the buffer layer 50 in FIG. 6 is formed by a plurality of sequential implants 51, 52 and 53 preferably of hydrogen of progressively decreasing depth but increasing concentration to form the $N^+$ buffer zone 50 (zone 30 in FIG. 4).

Preferably, implants 51, 52 and 53 are hydrogen implants at $1E13/cm^2$; $1E14/cm^2$; $1E15/cm^2$, at 200 KeV, 150 KeV and 100 KeV, respectively.

Note that other species can be used for the implant, for example two sequential phosphorus implants, both at $1E14/cm^2$ and at 450 KeV and 600 KeV, respectively.

While the invention has been described for the manufacture of an IGBT, the invention can also be used to provide an ohmic contact to a silicon surface of any device, such as a MOSFET. Thus, to provide an ohmic contact on the backside of a vertical conduction MOSFET, hydrogen ions are implanted, in the energy range of 5 to 100 KeV and a dose of $1E14/cm^2$ to $1E16/cm^2$ into the backside or drain side of the wafer. The wafers are then annealed for 30 to 60 minutes at 300 to 400° C. (protecting the top surface integrity), followed by the sputtering of the back contact, for example, Ti/NiV/Ag. The highly doped $N^+$ silicon on the backside makes possible a very good contact to the metal.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. The process for making a punch-through IGBT in a float zone silicon wafer of the N type conductivity; said process comprising the steps of forming a plurality of junctions and metallizing for said junctions on the top surface of said wafer to define at least a portion of said IGBT; removing material from the bottom surface of said wafer to reduce the thickness of said wafer to a given value; implanting hydrogen ions into the bottom surface of said wafer at an implant energy in the range of about 100 KeV to 500 KeV to define an $N^+$ buffer layer to a given depth and concentration into said bottom surface; and forming a $P^-$ type collector region on the bottom of said $N^+$ buffer layer; forming a backside contact atop said $P^-$ type collector region; and annealing said hydrogen implant by raising said wafer to a temperature less than the temperature which damages the top side structure of said IGBT at a time after the implant thereof.

2. The process of claim 1, wherein said hydrogen implant is annealed prior to the formation of said $P^-$ collector region and said backside contact.

3. The process for making a punch-through IGBT in a float zone silicon wafer of the N type conductivity; said process comprising the steps of forming a plurality of junctions and metallizing for said junctions on the top surface of said wafer to define at least a portion of said IGBT; removing material from the bottom surface of said wafer to reduce the thickness of said wafer to a given value; implanting hydrogen ions into the bottom surface of said wafer to define an $N^+$ buffer layer to a given depth and concentration into said bottom surface; and forming a $P^-$ type collector region on the bottom of said $N^+$ buffer layer; forming a backside contact atop said $P^-$ type collector region; and annealing said hydrogen implant by raising said wafer to a temperature less than the temperature which damages the top side structure of said IGBT at a time after the implant thereof; wherein said hydrogen implant is annealed during the formation of said $P^-$ collector region and backside contact.

4. The process of claim 1, wherein said hydrogen implant has a dose of about $1E12/cm^2$ to about $1E16/cm^2$ and is annealed at a temperature of about 300° C. to about 400° C. from about 30 minutes to about 60 minutes.

5. The process of claim 4, wherein said hydrogen implant is annealed prior to the formation of said $P^-$ collector region and said backside contact.

6. The process of claim 4, wherein said $P^-$ collector region and said hydrogen implant is annealed during the formation of said backside contact.

7. The process of claim 1, wherein said backside metal is a sequential layered Al/Ti/NiV/Ag metal.

8. The process of claim 1, wherein said $P^-$ collector region anode is formed of a boron implant which is about 0.1 micron to about 0.5 micron deep.

9. The process of claim 8, wherein said boron implant has a dose of about $1E14/cm^2$ at about 50 KeV.

10. The process of claim 8, wherein said backside metal is a sequential layered Al/Ti/NiV/Ag metal.

11. The process of claim 9, wherein said backside metal is a sequential layered Al/Ti/NiV/Ag metal.

12. The process of claim 7, wherein said hydrogen implant has a dose of about $1E12/cm^2$ to about $1E16/cm^2$ and is annealed at a temperature of about 300° C. to about 400° C. from about 30 minutes to about 60 minutes.

13. The process of claim 12, wherein said hydrogen implant is annealed prior to the formation of said $P^-$ collector region and said backside contact.

14. The process of claim 12, wherein said hydrogen implant is annealed during the formation of said backside contact.

15. The process of claim 1, wherein said $P^-$ type collector region is formed by a layer of P type amorphous silicon.

16. The process for making a punch-through IGBT in a float zone silicon wafer of the N type conductivity; said process comprising the steps of forming a plurality of junctions and metallizing for said junctions on the top surface of said wafer to define at least a portion of said IGBT; removing material from the bottom surface of said wafer to reduce the thickness of said wafer to a given value; implanting hydrogen ions into the bottom surface of said wafer to define an $N^+$ buffer layer to a given depth and concentration into said bottom surface; and forming a $P^-$ type collector region on the bottom of said $N^+$ buffer layer; forming a backside contact atop said $P^-$ type collector region; and annealing said hydrogen implant by raising said wafer to a temperature less than the temperature which damages the top side structure of said IGBT at a time after the implant thereof; wherein said hydrogen is implanted in a plurality of separate sequential steps of progressively decreasing dose and progressively increasing energy.

17. The process of claim 1, wherein said dose reduces from about $1E13/cm^2$ to $1E15/cm^2$ and said energy increases from 100 KeV to 200 KeV.

18. The process of making contact to an N type bottom surface of a silicon semiconductor wafer which has a top side structure on the top surface thereof; said process comprising the steps of implanting hydrogen ions into said N type bottom surface at an implant energy in the range of about 5 KeV to about 100 KeV to increase the N type concentration thereof and applying a backside metal contact to said implanted surface region; and raising the temperature of said wafer to a temperature less than the temperature which damages said top side structure at a time after said implant step.

19. The process of claim 18, wherein said hydrogen implant is annealed prior to the formation of said backside contact.

20. The process of making contact to an N type bottom surface of a silicon semiconductor wafer which has a top side structure on the top surface thereof; said process comprising the steps of implanting hydrogen ions into said N type bottom surface to increase the N type concentration thereof and applying a backside metal contact to said implanted surface region; and raising the temperature of said wafer to a temperature less than the temperature which damages said top side structure at a time after said implant step; wherein said hydrogen implant is annealed during the formation of said backside contact.

21. The process of claim 18, wherein said hydrogen implant has a dose of about $1E14/cm^2$ to about $1E16/cm^2$ and is annealed at a temperature of about 300° C. to about 400° C. for from about 30 minutes to about 60 minutes.

22. The process of claim 18 wherein said backside metal is a sequential layered contact of titanium, nickel-vanadium and silver.

23. The process of making contact to an N type bottom surface of a silicon semiconductor wafer which has a top side structure on the top surface thereof; said process comprising the steps of implanting hydrogen ions into said N type bottom surface to increase the N type concentration thereof and applying a backside metal contact to said implanted surface region; and raising the temperature of said wafer to a temperature less than the temperature which damages said top side structure at a time after said implant step; wherein said hydrogen is implanted in a plurality of separate sequential steps of progressively decreasing dose and progressively increasing energy.

24. The process of claim 23, wherein said dose reduces from about $1E14/cm^2$ to $1E16/cm^2$ and said energy increases from 5 KeV to 100 KeV.

25. The process of claim 18, wherein said semiconductor wafer defines a vertical conduction power MOSFET.

* * * * *